United States Patent
Kang et al.

(10) Patent No.: US 10,699,991 B2
(45) Date of Patent: Jun. 30, 2020

(54) PACKAGED LIGHT EMITTING DEVICES INCLUDING ELECTRODE ISOLATION STRUCTURES AND METHODS OF FORMING PACKAGED LIGHT EMITTING DEVICES INCLUDING THE SAME

(71) Applicant: Samsung Electronics Co., Ltd., Suwon-si (KR)

(72) Inventors: Chi-Goo Kang, Yongin-si (KR); Sun-Woo Kim, Hwaseong-si (KR); Jong-Sup Song, Hwaseong-si (KR); Ho-Young Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/841,937

(22) Filed: Dec. 14, 2017

(65) Prior Publication Data

US 2018/0366615 A1    Dec. 20, 2018

(30) Foreign Application Priority Data

Jun. 15, 2017    (KR) .......................... 10-2017-0075824

(51) Int. Cl.
*H01L 23/495*        (2006.01)
*H01L 33/44*          (2010.01)
(Continued)

(52) U.S. Cl.
CPC ........ *H01L 23/49548* (2013.01); *H01L 23/48* (2013.01); *H01L 23/495* (2013.01);
(Continued)

(58) Field of Classification Search
CPC ....... H01L 23/48; H01L 23/49; H01L 23/495; H01L 23/49503; H01L 23/4951;
(Continued)

(56) References Cited

U.S. PATENT DOCUMENTS 6,448,633 B1 * 9/2002 Yee ..................... H01L 23/3107
                                                              257/666
6,525,386 B1 * 2/2003 Mills .................... B29C 45/401
                                                              257/100

(Continued)

FOREIGN PATENT DOCUMENTS

JP    2003-243719         8/2003
JP    2005-039100 A       2/2005
(Continued)

*Primary Examiner* — Eduardo A Rodela
(74) *Attorney, Agent, or Firm* — Sughrue Mion, PLLC

(57) ABSTRACT

A packaged light emitting device can include a mounting substrate including first and second electrode portions that are separated by a recess defined by a first side surface of the first electrode portion and a second side surface of the second electrode portion that is opposite the first side surface. An insulation support member can partially fill a lower portion of the recess to partially cover the first side surface and partially cover the second side surface. A light emitting device can be coupled to the first and second electrode portions of the mounting substrate and a sealing member can be on the mounting substrate covering the light emitting device.

13 Claims, 17 Drawing Sheets

(51) Int. Cl.
*H01L 23/00* (2006.01)
*H01L 33/38* (2010.01)
*H01L 33/48* (2010.01)
*H01L 33/62* (2010.01)
*H01L 23/48* (2006.01)

(52) U.S. Cl.
CPC ...... *H01L 23/4951* (2013.01); *H01L 23/4952* (2013.01); *H01L 23/49503* (2013.01); *H01L 23/49541* (2013.01); *H01L 24/14* (2013.01); *H01L 33/387* (2013.01); *H01L 33/44* (2013.01); *H01L 33/48* (2013.01); *H01L 33/483* (2013.01); *H01L 33/62* (2013.01); *H01L 33/486* (2013.01); *H01L 2224/0401* (2013.01); *H01L 2224/16245* (2013.01); *H01L 2224/48247* (2013.01); *H01L 2224/48465* (2013.01); *H01L 2924/181* (2013.01)

(58) Field of Classification Search
CPC .......... H01L 23/4952; H01L 23/49541; H01L 23/49548; H01L 23/49582; H01L 33/48; H01L 33/52; H01L 33/54; H01L 21/00
See application file for complete search history.

(56) References Cited

U.S. PATENT DOCUMENTS

| | | | |
|---|---|---|---|
| 8,519,427 | B2 | 8/2013 | Lee |
| 8,569,791 | B2 | 10/2013 | Chen et al. |
| 9,224,930 | B2 | 12/2015 | Takada |
| 9,276,180 | B2 | 3/2016 | Ishida et al. |
| 9,349,664 | B2 | 5/2016 | Ishida et al. |
| 2004/0108602 | A1* | 6/2004 | Nakajima ........... H01L 23/4334 257/787 |
| 2013/0234181 | A1* | 9/2013 | Watari ................. H01L 33/505 257/98 |
| 2014/0097529 | A1* | 4/2014 | Cruz ................. H01L 23/49541 257/676 |
| 2014/0131848 | A1* | 5/2014 | Lee ................... H01L 23/49861 257/676 |
| 2016/0093777 | A1 | 3/2016 | Sato et al. |
| 2016/0148860 | A1* | 5/2016 | Blakely ............... H01L 25/0753 257/88 |
| 2016/0225965 | A1 | 8/2016 | Chien et al. |

FOREIGN PATENT DOCUMENTS

| | | |
|---|---|---|
| JP | 2014-207349 A | 10/2014 |
| JP | 2016-066632 A | 4/2016 |
| KR | 10-1476771 | 11/2014 |
| KR | 2016-0036862 A | 4/2016 |

* cited by examiner

PACKAGED LIGHT EMITTING DEVICES INCLUDING ELECTRODE ISOLATION STRUCTURES AND METHODS OF FORMING PACKAGED LIGHT EMITTING DEVICES INCLUDING THE SAME

PRIORITY STATEMENT

This application claims priority under 35 U.S.C. § 119 to Korean Patent Application No. 10-2017-0075824, filed on Jun. 15, 2017, in the Korean Intellectual Property Office (KIPO), the contents of which are herein incorporated by reference in their entirety.

FIELD

The present invention relates to the field of electronics in general, and more particularly, to packaged light emitting devices and methods of forming packaged light emitting devices.

BACKGROUND

In some methods of manufacturing a conventional packaged light emitting device (LED), a light emitting device may be mounted on a lead frame and then covered with a molding material. As the number of the light emitting devices mounted on a circuit board increases, however, heat dissipating technologies may be needed.

SUMMARY

Embodiments according to the inventive concept can provide packaged light emitting diodes including electrode isolation structures and methods of forming the same. Pursuant to these embodiments, a packaged light emitting device can include a mounting substrate including first and second electrode portions that are separated by a recess defined by a first side surface of the first electrode portion and a second side surface of the second electrode portion that is opposite the first side surface the recess extending from the first side surface to the second side surface. An insulation support member can partially fill a lower portion of the recess to partially cover the first side surface and partially cover the second side surface. A light emitting device can be coupled to the first and second electrode portions of the mounting substrate and a sealing member can be on the mounting substrate covering the light emitting device.

In some embodiments, a packaged light emitting device can include a mounting substrate including first and second lower electrode portions separated from one another by a first groove in a first surface of the mounting substrate, first and second upper electrode portions on the first and second lower electrode portions respectively, the first and second upper electrode portions separated from one another by a second groove in a second surface of the mounting substrate that is opposite the first surface, the second groove connected to the first groove. An insulation support member can fill the first groove and a light emitting device can be mounted on the first and second upper electrode portions. A transparent film can cover a light emitting surface of the light emitting device and a sealing member can be on the mounting substrate covering a portion of the light emitting device.

A method of forming a packaged light emitting device can be provided by etching a first surface of a metal substrate to form first and second lower electrode portions separated by a first groove in the first surface of the metal substrate. An insulation support member can be formed in the first groove. A second surface of the metal substrate can be etched opposite the first surface, to form first and second upper electrode portions on the first and second lower electrode portions respectively, the first and second upper electrode portions being separated by a second groove in the second surface of the metal substrate, the first groove being connected to the second groove. A light emitting device can be mounted on the first and second upper electrode portions and forming a sealing member on the insulation support member and on the first and second upper electrode portions to cover the light emitting device.

BRIEF DESCRIPTION OF THE DRAWINGS

Example embodiments will be more clearly understood from the following detailed description taken in conjunction with the accompanying drawings.

FIG. 1 is a plan view illustrating a light emitting device package in accordance with example embodiments.

FIG. 2 is a cross-sectional view taken along the line I-I' in FIG. 1.

FIG. 3 is a cross-sectional view taken along the line II-II' in FIG. 1.

FIG. 4 is a bottom view illustrating the light emitting device package in FIG. 1.

FIGS. 5, 7, 11 and 19 are plan views illustrating stages of manufacturing a light emitting device package in accordance with example embodiments.

FIGS. 6, 8, 9, 10, 12, 13, 14, 15, 16, 17, 18, 20, 21, 22, 23 and 24 are cross-sectional views illustrating stages of manufacturing the light emitting device package in accordance with example embodiments.

FIG. 25 is a plan view of FIG. 24.

FIG. 26 is a side view of FIG. 24.

FIG. 27 is a bottom view of FIG. 24.

FIG. 28 is a cross-sectional view illustrating a light emitting device package in accordance with example embodiments.

FIGS. 29 and 30 are cross-sectional views illustrating stages of a method of manufacturing a light emitting device package in accordance with example embodiments.

FIGS. 31 to 34 are plan views illustrating mounting substrates of a light emitting device package in accordance with example embodiments.

DETAILED DESCRIPTION OF EMBODIMENTS ACCORDING TO THE INVENTIVE CONCEPT

Embodiments of the present inventive subject matter now will be described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

It will be understood that, as used herein, the term light emitting device may include a light emitting diode, laser diode and/or other light emitting semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. It will be further understood that the electrodes of the light emitting devices described herein can include an electrode for a p-type layer of the light emitting device and an electrode for an n-type layer of the light emitting device.

Figure 1:
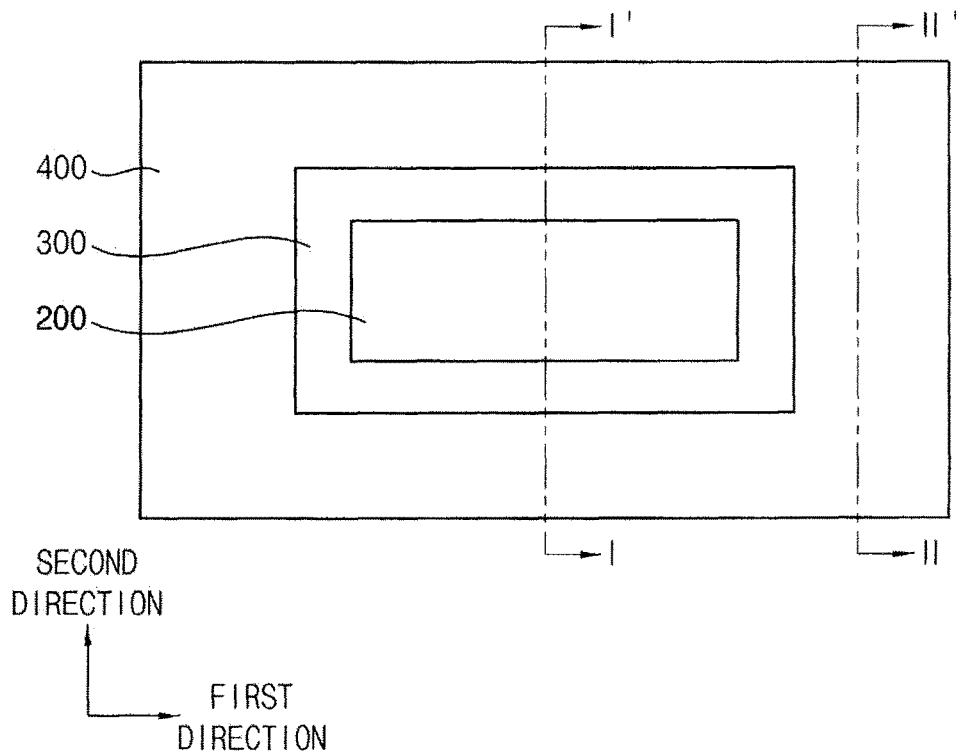
FIGS. 1 to 34 represent non-limiting, example embodiments as described herein.
Figure 2:
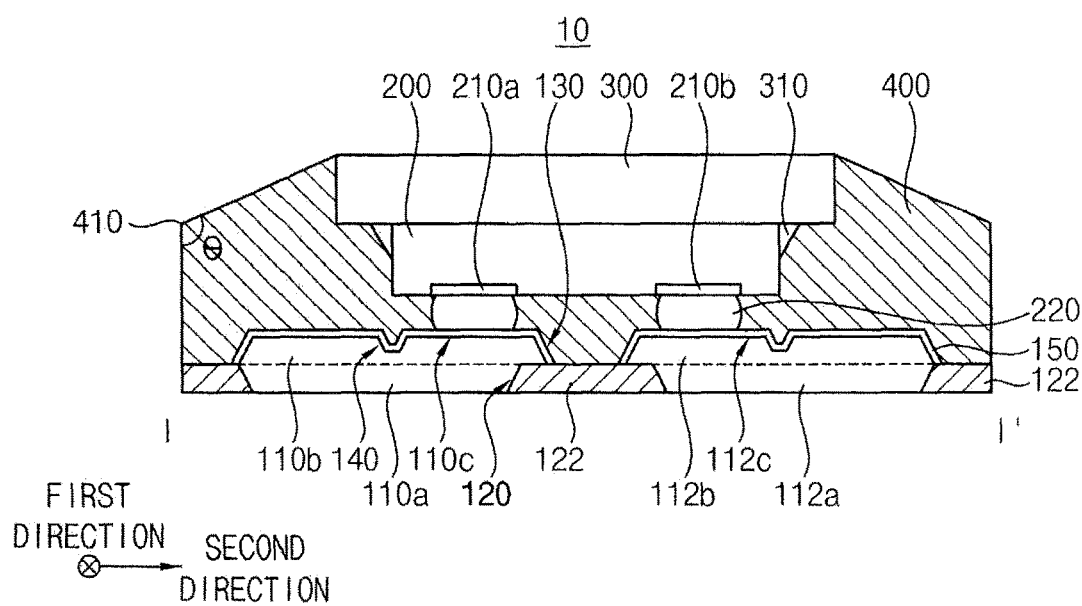
Figure 3:
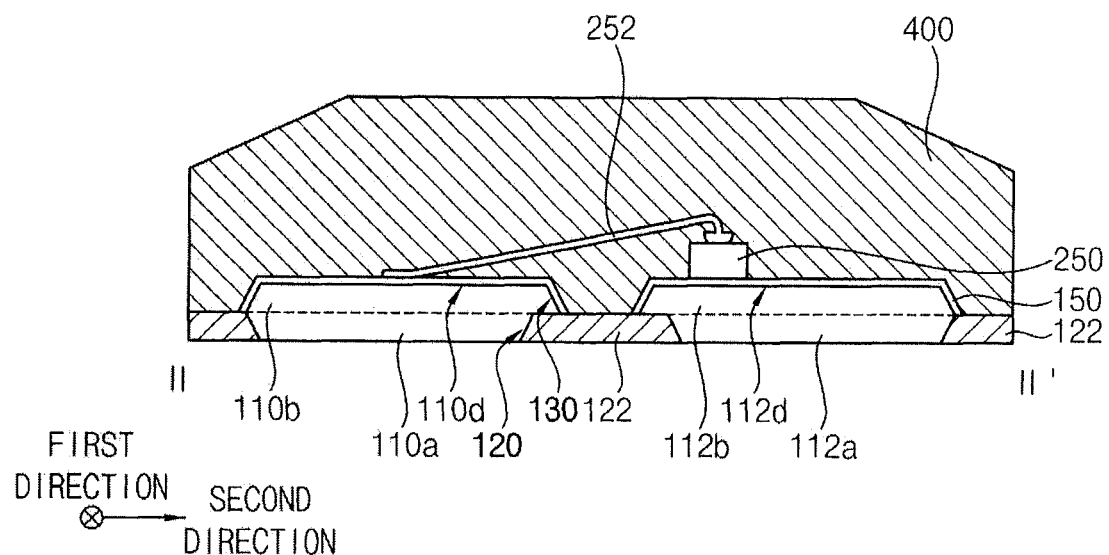
Figure 4:
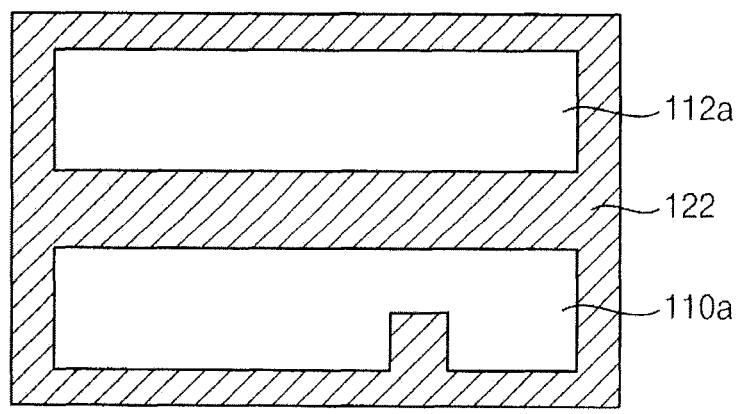

FIG. 1 is a plan view illustrating a light emitting device package in accordance with example embodiments. FIG. 2 is a cross-sectional view taken along the line I-I' in FIG. 1. FIG. 3 is a cross-sectional view taken along the line II-II' in FIG. 1. FIG. 4 is a bottom view illustrating the light emitting device package in FIG. 1.

Referring to FIGS. 1 to 4, a packaged light emitting device 10 may include a mounting substrate having first and second electrode portions separated and insulated from each other, a light emitting device 200 mounted on the first and second electrode portions of the mounting substrate, a transparent film 300 covering an upper surface of the light emitting device 200, and a sealing member 400 covering the light emitting device 200 and the transparent film 300 on the mounting substrate.

In example embodiments, the mounting substrate may be used as a package body for mounting the light emitting device 200. A first surface of the mounting substrate may provide a mounting region for mounting the light emitting device, a diode, etc, and a second surface of the mounting substrate opposite to the first surface may provide an external connection region for electrical connection with an external circuit or external circuit board.

The mounting substrate may include the first and second electrode portions separated by a recess, and an insulation support member 122 filing a lower portion of the recess and covering a lower side surface of each of the first and second electrode portions. The first electrode portion may include a first lower electrode portion 110a and a first upper electrode portion 110b on the first lower electrode portion 110a, and the second electrode portion may include a second lower electrode portion 112a and a second upper electrode portion 112b on the second lower electrode portion 112a.

The first and second electrode portions may include a metal having excellent electrical conductivity and heat dissipating properties. Examples of the metal may be copper (Cu), nickel (Ni), magnesium (Mg), gold (Au), silver (Ag), palladium (Pd) or a combination thereof. The insulation support member 122 may include an insulating material such as epoxy molding compound (EMC), silicon molding compound (SMC), silicon resin (SR), etc. that is configured to electrically isolate the first and second electrode portions from each other.

A first groove 120 may be formed between the first lower electrode portion 110a and the second lower electrode portion 112a, and a second groove 130 may be formed between the first upper electrode portion 110b and the second upper electrode portion 112b. The first groove 120 and the second groove 130 may be connected to each other to form the recess. A width of the first groove 120 may be the same as or different from a width of the second groove 130.

The insulation support member 122 may fill up the first groove 120, cover side surfaces of the first and second lower electrode portions 110a and 112a, and expose the first and second upper electrode portions 110b and 112b. Upper surfaces of the first and second electrode portions may be higher than an upper surface of the insulation support member 122 between the first and second electrode portions. Upper surfaces of the first and second upper electrode portions 110b and 112b may be higher than the upper surface of the insulation support member 122 exposed through the second groove 130.

In example embodiments, the light emitting device 200 may be mounted on the mounting substrate in a flip chip bonding method. First and second electrodes 210a and 210b may be provided on a lower surface of the light emitting device 200. The light emitting device 200 may be mounted on the mounting substrate such that the lower surface of the light emitting device 200 faces the mounting substrate. The light emitting device 200 may be mounted on the mounting substrate via connection members 220 such as solder bumps. It will be understood that, in some embodiments, light can be emitted from the upper surface of the light emitting device 200 that is opposite the lower surface.

The first and second upper electrode portions 110b and 112b arranged side by side with each other in a second direction may have first and second bonding regions 110c and 112c bonded to the electrodes 210a and 210b of the light emitting device respectively. The first electrode 210a may be bonded to the first bonding region 110c of the first upper electrode portion 110b by the connection member 220, and the second electrode 210b may be bonded to the second bonding region 112c of the second upper electrode portion 112b by the connection member 220.

A longitudinal direction of the light emitting device 200 may be parallel with a first direction. A plurality of the first electrodes 210a may be arranged in the first direction on the lower surface of the light emitting device 200 corresponding to a plurality of the first bonding regions 110c to be spaced apart from each other in the first direction. A plurality of the second electrodes 210b may be arranged in the first direction on the lower surface of the light emitting device 200 corresponding to a plurality of the second bonding regions 112c to be spaced apart from each other in the first direction.

First recesses 140 may be formed in the upper surfaces of the first and second upper electrode portions 110b and 112b respectively. The first recess 140 of the first upper electrode portion 110b may be formed adjacent to the first bonding region 110c. The first recess 140 of the second upper electrode portion 112b may be formed adjacent to the second bonding region 112c.

The insulation support member 122 may be formed lower than the upper surfaces of the first and second electrode portions to thereby prevent spreading of the solder bump during the flip chip bonding process. Additionally, the first recesses 140 may be formed around the first and second bonding regions 110c and 112c to thereby prevent spreading of the solder bump during the flip chip bonding process.

In example embodiments, as illustrated in FIG. 3, the light emitting device package 10 may further include a diode 250. The diode 250 may be arranged adjacent to the light emitting device 200 on the mounting substrate.

For example, the diode 250 may include a zener diode. A reverse current generated when a reverse voltage is applied may be blocked from flowing to the light emitting device 200, to thereby prevent damage to the light emitting device.

The diode 250 may be mounted on the mounting substrate by a wire bonding method. Alternatively, the diode 250 may be mounted on the mounting substrate by a flip chip bonding method.

In example embodiments, the diode 250 may be mounted on the second upper electrode portion 112b. The diode 250 may include an upper electrode electrically connected to the first upper electrode portion 110b and a lower electrode electrically connected to the second upper electrode portion 112b.

The first and second upper electrode portions 110b and 112b facing each other may have third and fourth bonding regions 110d and 112d bonded to connection members for electrical connection with the diode, respectively. The upper electrode of the diode 250 may be bonded to the third bonding region 110d of the first upper electrode portion 110b by a bonding wire 252, and the lower electrode of the diode 250 may be bonded to the fourth bonding region 112d of the second upper electrode portion 112b by a conductive connection member. The conductive connection member may include a conductive film.

In example embodiments, the transparent film 300 may be adhered on the upper surface of the light emitting device 200. The transparent film 300 may include a silicon film. Additionally, an adhesive film 310 may be provided between a lower surface of the transparent film 300 and an outer surface of the light emitting device 200.

The sealing member 400 may be formed on the mounting substrate to cover the light emitting device 200 and a portion of the transparent film 300. The sealing member 400 may be formed to expose an upper surface of the transparent film 300. The sealing member 400 may cover the first surface of the mounting substrate, side surfaces of the transparent film 300 and side surfaces of the light emitting device 200. For example, the sealing member 400 may include titanium dioxide ($TiO_2$). The sealing member 400 may include a transparent material. Additionally, the sealing member 400 may further include a fluorescent material.

In example embodiments, an upper side edge 410 of the sealing member 400 may have an obtuse angle (θ) with respect to a side surface of the sealing member 400. For example, the obtuse angle (θ) of the upper side edge 410 of the sealing member 400 may range from about 95 degrees to about 150 degrees.

Hereinafter, a method of manufacturing the light emitting device package in FIG. 1 will be explained.

Figure 24:
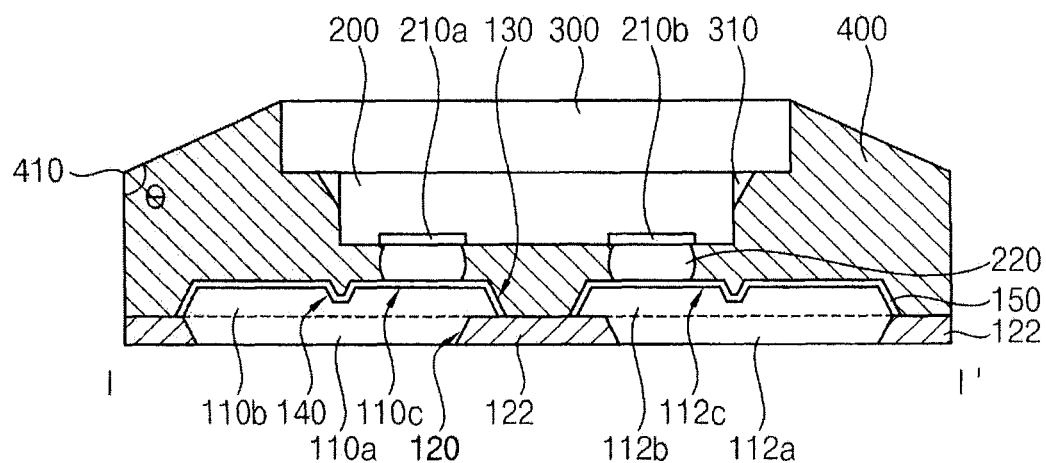
Figure 25:
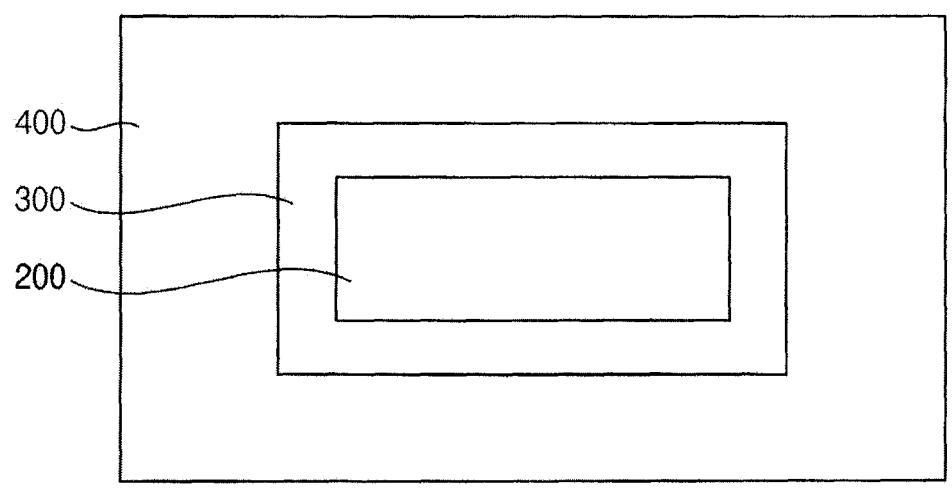
Figure 26:
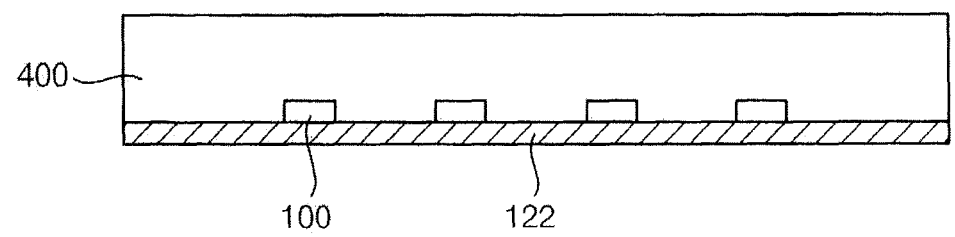
Figure 27:
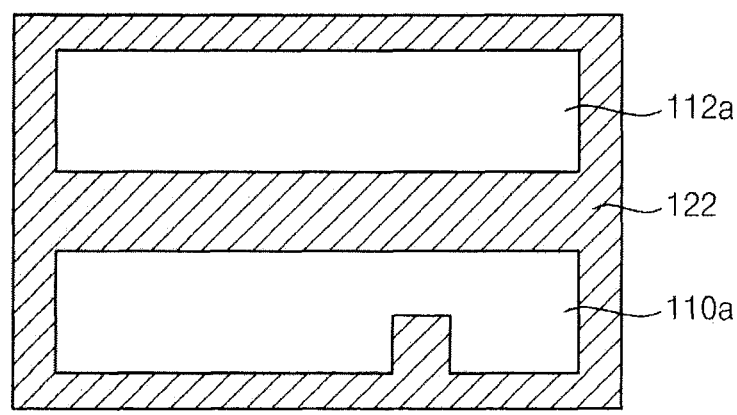

FIGS. 5, 7, 11 and 19 are plan views illustrating stages of manufacturing a light emitting device package in accordance with example embodiments. FIGS. 6, 8, 9, 10, 12, 13, 14, 15, 16, 17, 18, 20, 21, 22, 23 and 24 are cross-sectional views illustrating stages of manufacturing the light emitting device package in accordance with example embodiments. FIGS. 6, 8, 9, 10, 12, 13, 14, 16, 18, 20, 22, 23 and 24 are cross-sectional views taken along the line I-I' in the corresponding plan views. FIGS. 15, 17 and 21 are cross-sectional views taken along the line II-II' in the corresponding plan views. FIG. 25 is a plan view of FIG. 24. FIG. 26 is a side view of FIG. 24. FIG. 27 is a bottom view of FIG. 24.

Figure 5:
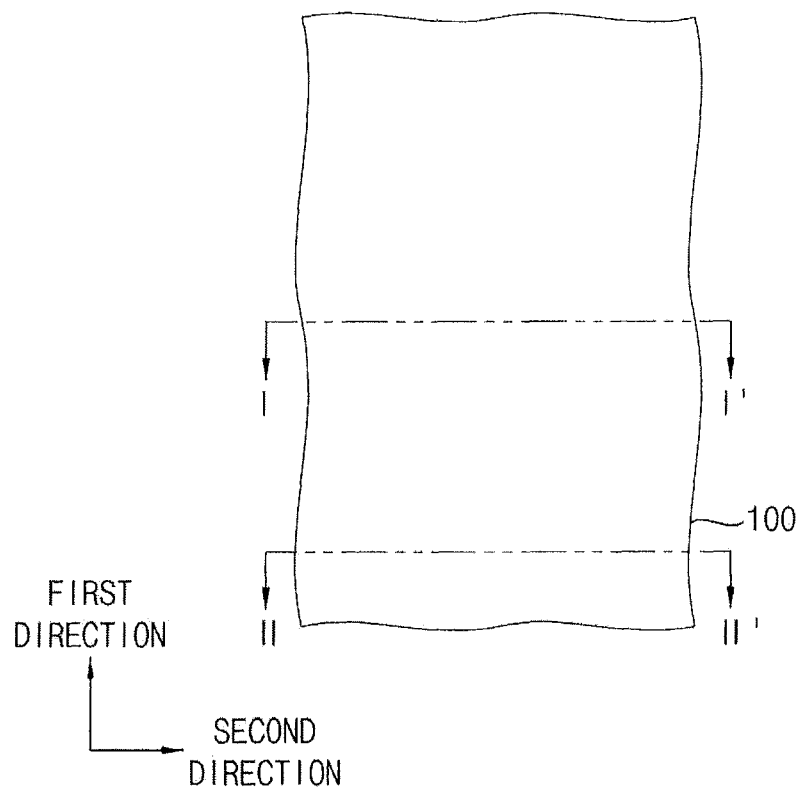
Figure 6:
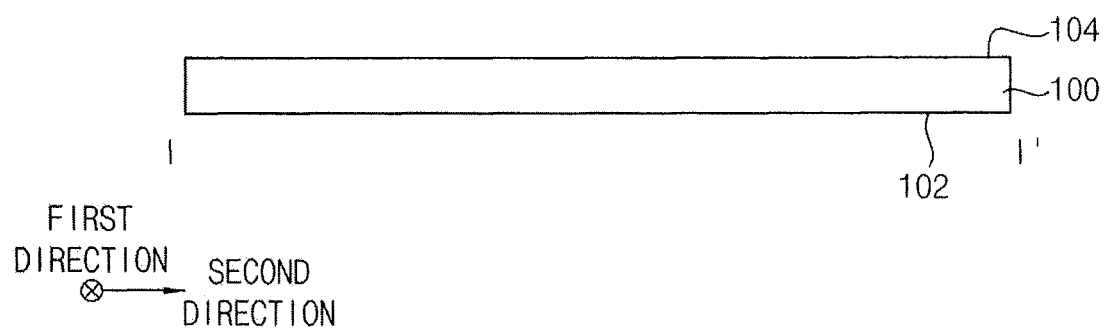

Referring to FIGS. 5 and 6, first, a metal substrate 100 may be prepared. In example embodiments, the metal substrate 100 may be used as a package body for mounting a light emitting device. The metal substrate 100 may have a first surface 102 and a second surface 104 opposite to each other. For example, the first surface 102 may provide a mounting region for mounting the light emitting device, a diode, etc, and the second surface 104 may provide an external connection region for electrical connection with an external circuit, tape board or other apparatus suitable for mounting light emitting diodes.

The metal substrate 100 may include a metal having excellent electrical conductivity and heat dissipating properties. Examples of the metal may be copper (Cu), nickel (Ni), magnesium (Mg), gold (Au), silver (Ag), palladium (Pd) or a combination thereof. Other metals may be used.

Figure 7:
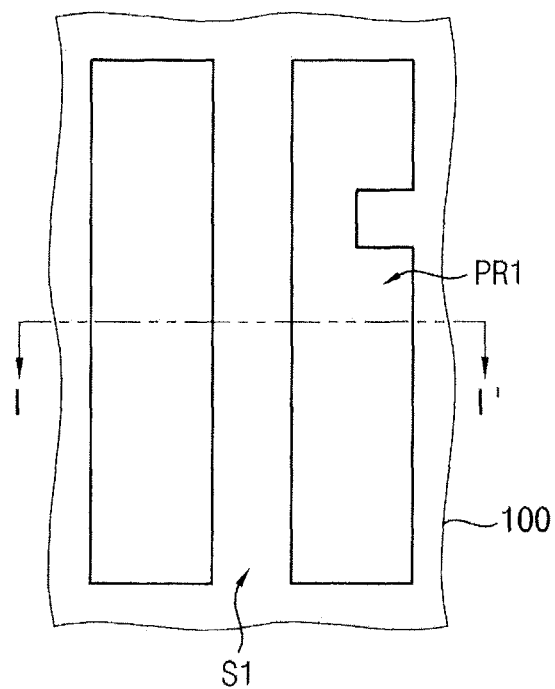
Figure 8:
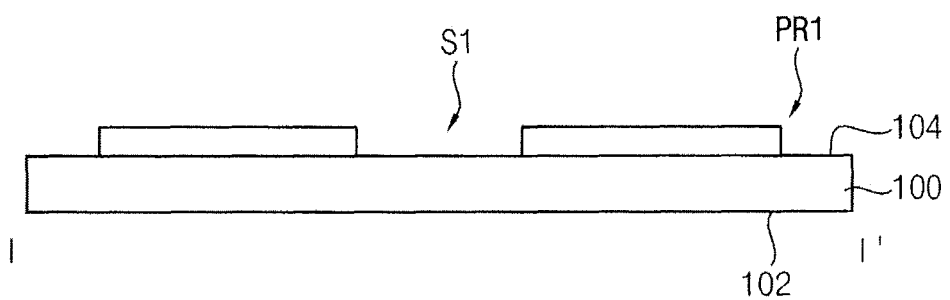

Referring to FIGS. 7 and 8, a first photoresist pattern PR1 may be formed on the second surface 104 of the metal substrate 100. The first photoresist pattern PR1 may have first and second line patterns spaced apart from each other. Each of the first and second line patterns may have an isolated shape of the entire region of the metal substrate 100 used as the package body. A first opening S1 may be formed between the first and second line patterns. The first opening S1 may extend in a first direction.

Alternatively, the first opening S1 may include a first extending portion and a second extending portion connected to each other and extending in different directions. For example, the first extending portion may extend in the first direction, and the second extending portion may extend from an end portion of the first extending portion in a third direction different from the first direction.

Figure 9:
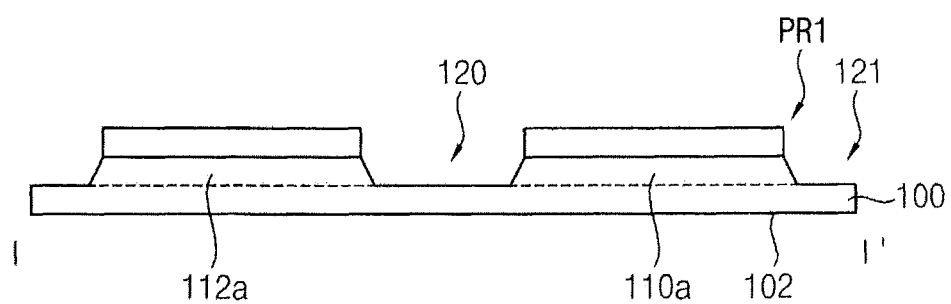
Figure 10:
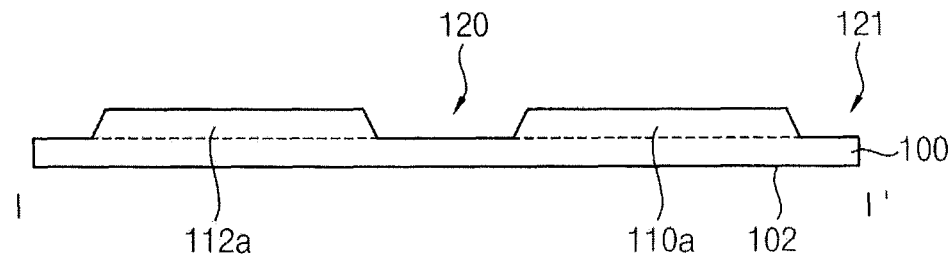

Referring to FIGS. 9 and 10, a portion of the metal substrate 100 exposed by the first photoresist pattern PR1 may be etched to form a first groove 120 having a predetermined depth from the second surface 104 of the metal substrate 100. Then, the first photoresist pattern PR1 may be removed from the metal substrate 100.

In example embodiments, the portion of the metal substrate 100 may be etched using the first photoresist pattern PR1 as an etching mask to form the first groove 120 having a predetermined depth from the second surface 104 of the metal substrate 100 and first edge grooves 121. A first lower electrode portion 110a and a second lower electrode portion 112a may be defined by the first groove 120 and the first edge grooves 121. The portion of the metal substrate 100 may be removed by an isotropic etch process.

For example, the first groove 120 and the first edge grooves 121 may be formed by the etch process to have the depth substantially the same as half of a thickness of the metal substrate 100 from the second surface 104 of the metal substrate 100. In this case, the first and second lower electrode portions 110a and 112a may have a thickness substantially the same as half of the substrate thickness from the second surface 104 of the metal substrate 100.

The first groove 120 may extend in the first direction. Alternatively, when the first opening S1 includes the first and second extending portions extending in different directions, the first groove may include a first extending groove portion extending in the first direction and a second extending groove portion extending from an end portion of the first extending groove portion in the third direction different from the first direction.

Figure 11:
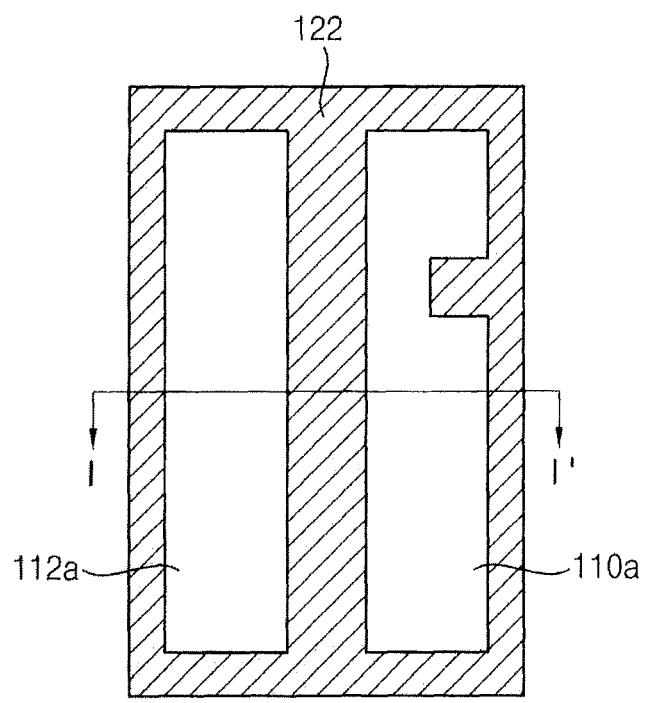
Figure 12:
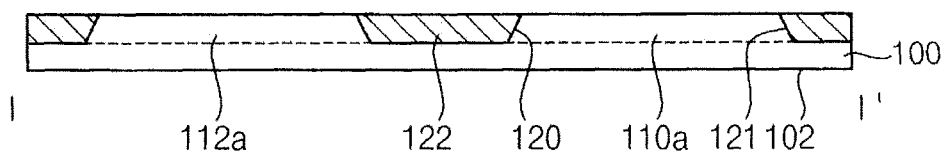

Referring to FIGS. 11 and 12, an insulation support member 122 may be formed to fill the first groove 120 and the first edge grooves 121. In example embodiments, after an insulation material is coated on the second surface 104 of the metal substrate 100, an upper portion of the coated insulation material may be removed until surfaces of the first and second lower electrode portions 110a and 112a are exposed, to form the insulation support member 122.

The insulation support member 122 may be formed to surround a side surface of the first lower electrode portion 110a. The insulation support member 122 may be formed to surround a side surface of the second lower electrode portion 112a.

The insulation support member 122 may include an electrically insulating material such as epoxy molding compound (EMC), silicon molding compound (SMC), silicon resin (SR), etc. A surface of the insulation support member 122 may be coplanar with the surfaces of the first and second lower electrode portions 110a and 112a. As mentioned later, the first and second lower electrode portions 110a and 112 may be electrically connected to an external circuit or external circuit board.

Figure 13:
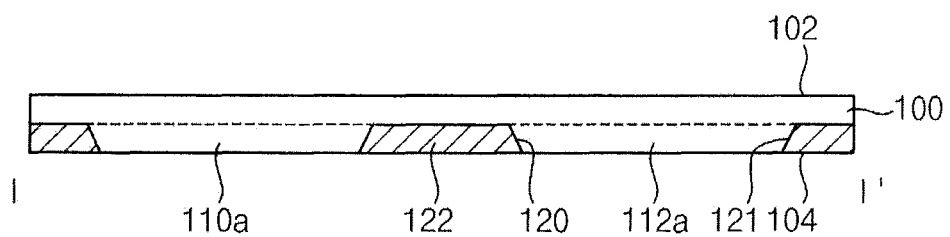
Figure 14:
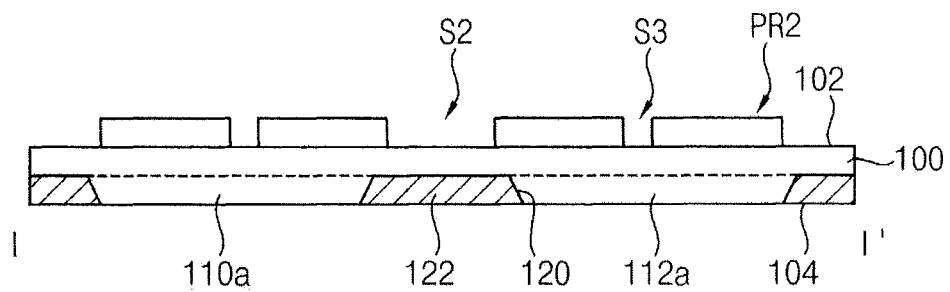
Figure 15:
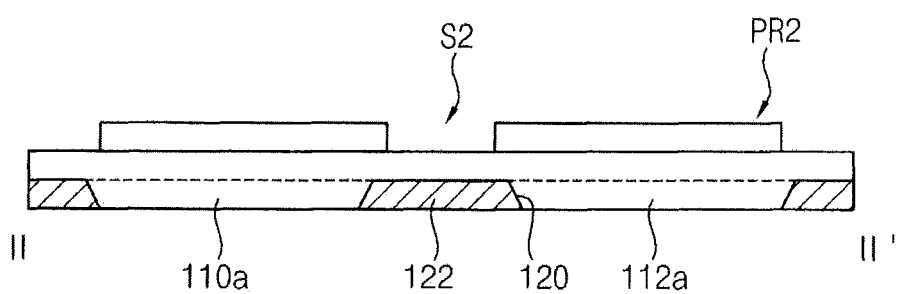

Referring to FIGS. 13, 14 and 15, in order to process the first surface 102 of the metal substrate 100, the metal substrate 100 may be turned over, and then, a second photoresist pattern PR2 may be formed on the first surface 102 of the metal substrate 100.

Similarly to the first photoresist pattern PR1, the second photoresist pattern PR2 may have third and fourth line patterns spaced apart from each other. A second opening S2 may be formed between the third and fourth line patterns. The second opening S2 may extend in the first direction. The second opening S2 may include a third extending portion extending in the first direction and a fourth extending portion extending from an end portion of the third extending portion in a third direction different from the first direction.

The third and fourth line patterns may have a third opening S3 exposing a portion of the metal substrate adjacent to a region where a connection member for electrical connection with the light emitting device is arranged, respectively. The second opening S2 may have a first width, and the third opening S3 may have a second width less than the first width.

Figure 16:
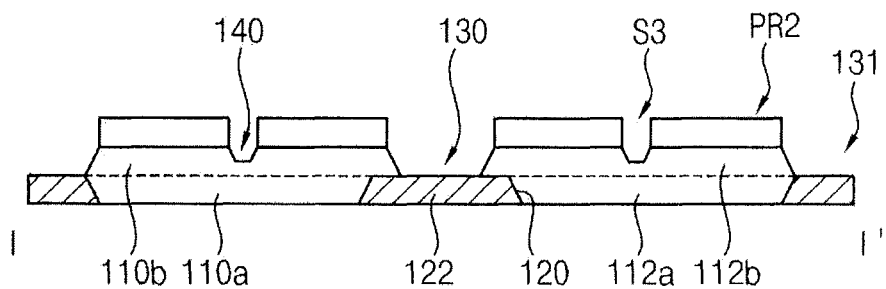
Figure 17:
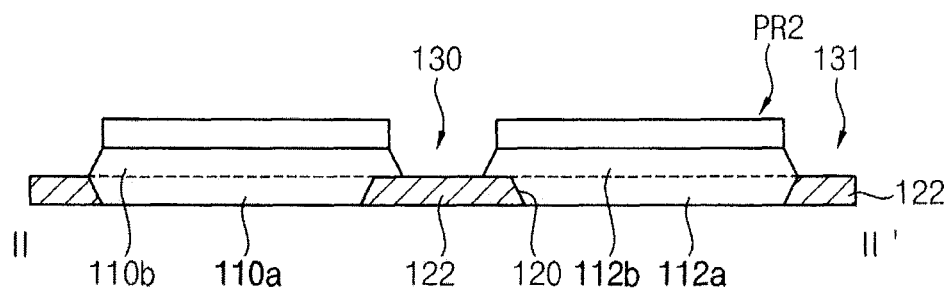

Referring to FIGS. 16 and 17, a portion of the metal substrate 100 exposed by the second photoresist pattern PR2 may be etched to form a second groove 130 having a predetermined depth from the first surface 102 of the metal substrate 100. Then, the second photoresist pattern PR2 may be removed from the metal substrate 100.

In example embodiments, the portion of the metal substrate 100 may be etched using the second photoresist pattern PR2 as an etching mask to form the second groove 130 having a predetermined depth from the first surface 102 of the metal substrate 100, second edge grooves 131 and a first recess 140. A first upper electrode portion 110b and a second upper electrode portion 112b may be defined by the second groove 130 and the second edge grooves 131. The portion of the metal substrate 100 may be removed by an isotropic etch process.

For example, the second groove 130 and the second edge grooves 131 may be formed by the etch process to have the depth substantially the same as half of the substrate thickness from the first surface 102 of the metal substrate 100. In this case, the first and second upper electrode portions 110b and 112b may have a thickness substantially the same as half of the substrate thickness from the first surface 102 of the metal substrate 100.

In example embodiments, the second groove 130 may be connected to the first groove 120 to form a recess penetrating through the metal substrate 100. The second edge groove 131 may be connected to the first edge groove 121. The second groove 130 may be formed to expose a portion of the insulation support member 122. The second edge groove 131 may be formed to expose a portion of the insulation support member 122.

Thus, the metal substrate 100 may be divided into two electrode portions by the insulation support member 122, that is, a first electrode portion and a second electrode portion. The first electrode portion may include the first lower electrode portion 110a and the first upper electrode portion 110b. The second electrode portion may include the second lower electrode portion 112a and the second upper electrode portion 112b. The first and second electrode portions may be spaced apart by the recess that is defined by the second groove 130 and the first groove 120. The first and second electrode portions may be electrically insulated from each other by the insulation support member 122.

Figure 19:
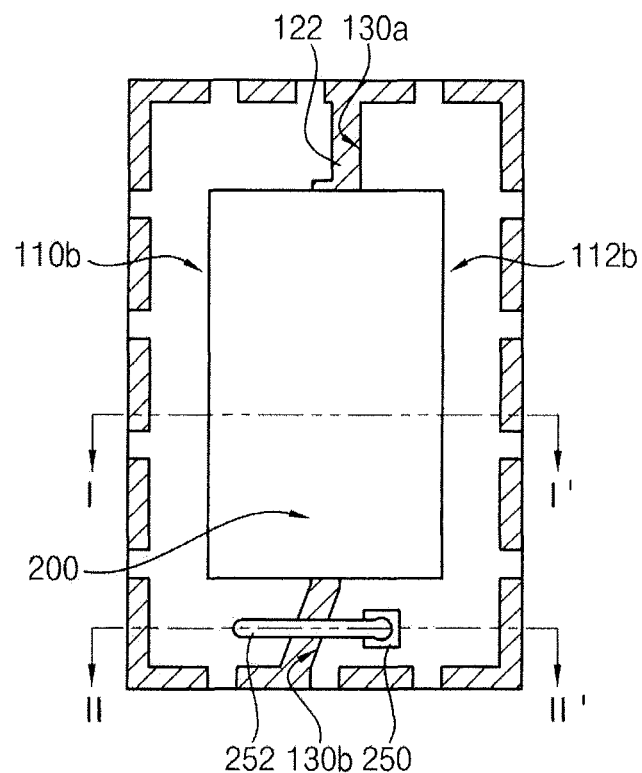

The second groove 130 may include third and fourth extending groove portions 130a and 130b (see FIG. 19). The third extending groove portion 130a may extend in the first direction, and the fourth extending groove portion 130b may extend from an end portion of the third extending groove portion 130a in the third direction different from the first direction.

When the first groove 120 and/or the second groove 130 include extending groove portions extending in different directions, the recess may also include extending recess portions extending in the different directions.

The first recess 140 may have a depth from the first surface 102 of the substrate 100 less than the second groove 130. The first recesses 140 may be formed in the surfaces of the first and second upper electrode portions 110b and 112b respectively. The first recesses 140 may be formed in a region where the light emitting device is mounted.

Figure 18:
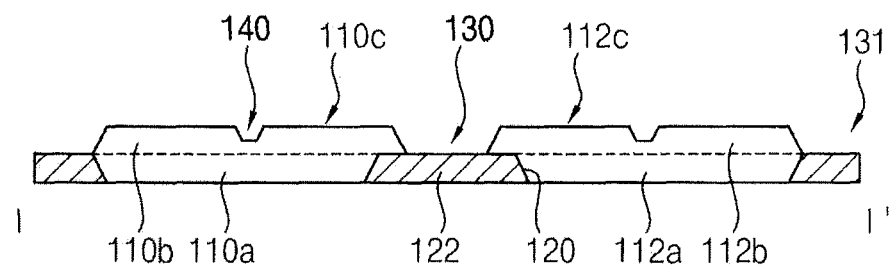

Referring to FIG. 18, the second photoresist pattern PR2 may be removed from the metal substrate 100 to form a mounting substrate for mounting the light emitting device and the diode.

The mounting substrate may include the first and second electrode portions separated by the first and second grooves 120 and 130 connected to each other, that is, the recess, and the insulation support member 122 surrounding at least a lower side surface of each of the first and second electrode portions to support the first and second electrode portions.

The first electrode portion may include the first lower electrode portion 110a and the first upper electrode portion 110b. The second electrode portion may include the second lower electrode portion 112a and the second upper electrode portion 112b. The insulation support member 122 may surround a side surface of the first lower electrode portion 110a and a side surface of the second lower electrode portion 112a. The first upper electrode portion 110b and the second upper electrode portion 112b may be exposed by the insulation support member 122. The insulation support member 122 may be exposed through the second groove 130 between the first and second upper electrode portions 110b and 112b. Upper surfaces of the first and second electrode portions may be positioned higher than an upper surface of the insulation support member 122 between the first and second electrode portions.

The first and second upper electrode portions 110b and 112b facing each other may have first and second bonding regions 110c and 112c configured to bond to electrodes of the light emitting device respectively. The first recesses 140 may be formed in the surfaces of the first and second upper electrode portions 110b and 112b, respectively. The first recess 140 of the first upper electrode portion 110b may be formed adjacent to the first bonding region 110c. The first recess 140 of the second upper electrode portion 112b may be formed adjacent to the first bonding region 110c.

The first and second upper electrode portions 110b and 112b facing each other may have third and fourth bonding regions 110d and 112d (see FIG. 21) configured to bond to connection members for electrical connection with electrodes the diode 250, respectively.

Figure 20:
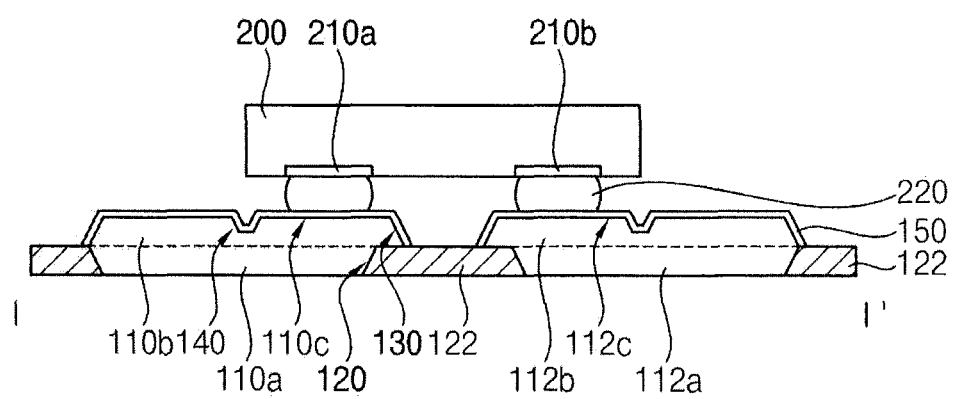
Figure 21:
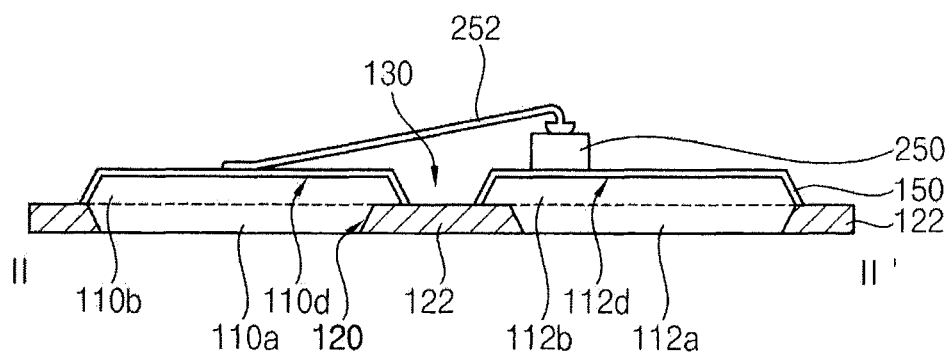

Referring to FIGS. 19, 20 and 21, an electroplating layer 150 may be formed on the surfaces of the first and second upper electrode portions 110b and 112b, and a light emitting device 200 and a diode 250 may be mounted on the mounting substrate.

In example embodiments, the electroplating layer 150 may be formed on the surfaces of the first and second upper electrode portions 110b and 112b by an electroplating process. In order to improve an adhesive strength with a following sealing member, the electroplating layer 150 may be surface-treated to have a predetermined surface roughness.

The light emitting device 200 may be a photoelectric device which generates a light with a predetermined wavelength by an external power supply. For example, the light emitting device 200 may include a semiconductor light emitting diode (LED) chip having an n-type semiconductor layer, a p-type semiconductor layer and an active layer therebetween. Other layers may also be included in the light emitting device 200.

The light emitting device 200 may be mounted on the mounting substrate by a flip chip bonding method. First and second electrodes 210a and 210b may be provided on a lower surface of the light emitting device 200. The light emitting device 200 may be mounted on the mounting substrate such that the lower surface of the light emitting device 200 faces the mounting substrate. The light emitting device 200 may be mounted on the mounting substrate via connection members 220 such as solder bumps. The first electrode 210a may be bonded to the first bonding region 110c of the first upper electrode portion 110b by the connection member 220, and the second electrode 210b may be bonded to the second bonding region 112c of the second upper electrode portion 112b by the connection member 220.

A longitudinal direction of the light emitting device 200 may be parallel with the first direction. A plurality of the first electrodes 210a may be arranged in the first direction on the lower surface of the light emitting device 200 corresponding to a plurality of the first bonding regions 110c of the first upper electrode portion 110b. A plurality of the second electrodes 210b may be arranged in the first direction on the lower surface of the light emitting device 200 corresponding to a plurality of the second bonding regions 112c of the second upper electrode portion 112b.

In example embodiments, the insulation support member 122 may be arranged between the first and second lower electrode portions 110a and 112a, and the second groove 130 may be formed between the first and second upper electrode portions 110b and 112b to expose the insulation support member 122. The upper surfaces of the first and second upper electrode portions 110b and 112b may be formed higher than the upper surface of the insulation support member 122, that is, a bottom surface of the second groove 130.

Accordingly, the insulation support member 122 may be formed lower than the upper surfaces of the first and second electrode portions to thereby prevent spreading of the solder bump during the flip chip bonding process. Additionally, the first recesses 140 may be formed around the first and second bonding regions 110c and 112c to thereby prevent spreading of the solder bump during the flip chip bonding process.

The diode 250 may be mounted on the second upper electrode portion 112b. The diode 250 may include an upper electrode electrically connected to the first upper electrode portion 110b and a lower electrode electrically connected to the second upper electrode portion 112b. For example, the upper electrode may be bonded to the third bonding region 110d of the first upper electrode portion 110b by a bonding wire 252 and the lower electrode may be bonded to the fourth bonding region 112d of the second upper electrode portion 112b by a conductive connection member. The conductive connection member may include a conductive film.

In example embodiments, the diode 250 may be mounted on the mounting substrate by a wire bonding method. However, it may not be limited thereto. For example, the diode 250 may be mounted on the mounting substrate by a flip chip bonding method where the diode 250 is configured for bonding without the use of wires.

Figure 22:
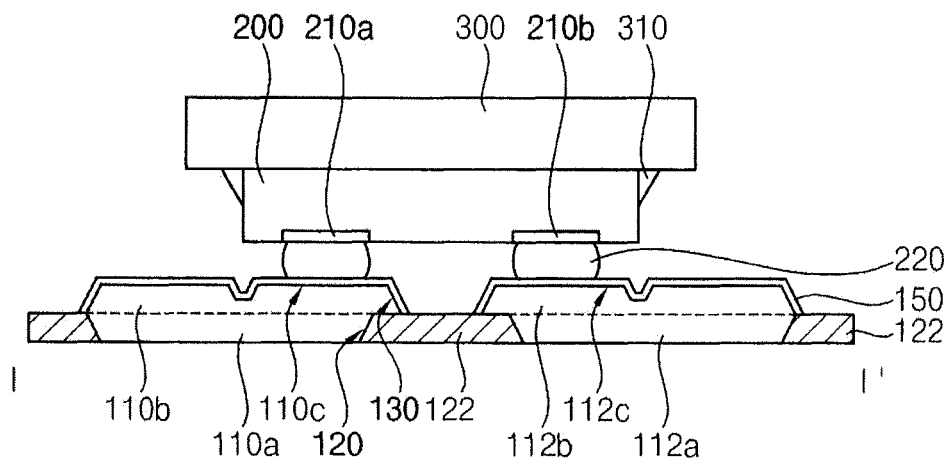
Figure 23:
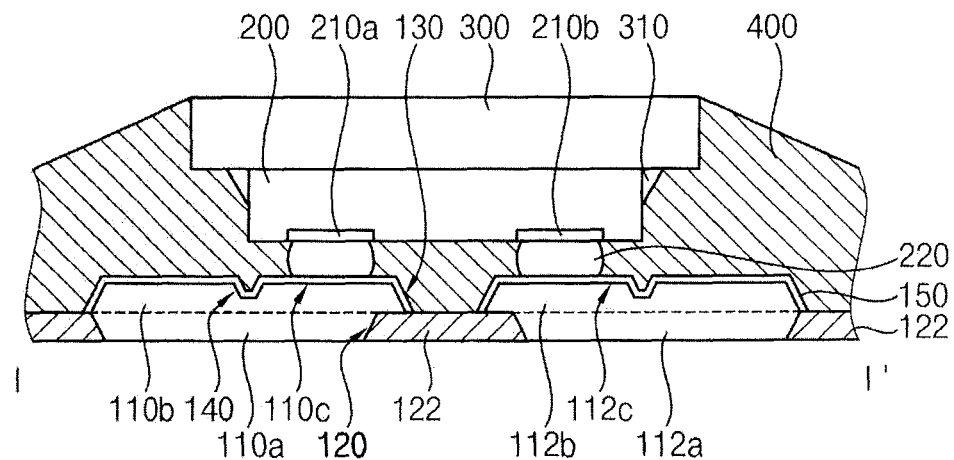

Referring to FIGS. 22 and 23, after a transparent film 300 is adhered on the upper surface of the light emitting device 200, a sealing member 400 may be formed on the mounting substrate to cover the light emitting device 200 and the transparent film 300.

In example embodiments, the transparent film 300 may be adhered on the upper (i.e. light emitting) surface of the light emitting device 200. The transparent film 300 may include a silicon film. Additionally, an adhesive film 310 may be formed between a lower surface of the transparent film 300 and an outer surface of the light emitting device 200.

Then, the sealing member 400 may be dispensed onto the mounting substrate to cover the light emitting device 200 and a portion of the transparent film 300. The sealing member 400 may be formed to expose an upper surface of the transparent film 300. The sealing member 400 may be formed to cover the first surface of the mounting substrate, side surfaces of the transparent film 300 and side surfaces of the light emitting device 200. For example, the sealing member 400 may include titanium dioxide (TiO$_2$). The sealing member 400 may include a transparent material to improve light extraction. Additionally, the sealing member 400 may further include a fluorescent material.

The dispensed sealing member 400 may have a beveled surface along a peripheral region by the second edge grooves 131 formed along the peripheral region of the mounting substrate.

Referring to FIGS. 24 to 27, the mounting substrate may be diced to form a singulated light emitting device package.

An upper side edge 410 of the sealing member 400 of the light emitting device package may have an obtuse angle (θ) with respect to a side surface thereof. For example, the obtuse angle (θ) of the upper side edge 410 of the sealing member 400 may range from about 95 degrees to about 150 degrees.

Figure 28:
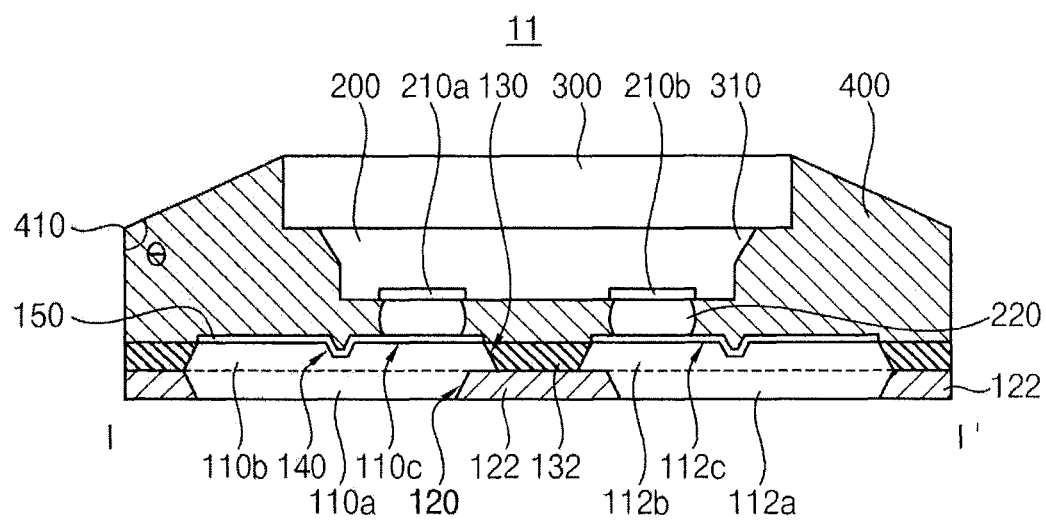

FIG. 28 is a cross-sectional view illustrating a light emitting device package in accordance with example embodiments. The light emitting device package may be substantially the same as or similar to the light emitting device package as described with reference to FIG. 1, except for a second insulation support member. Thus, same reference numerals will be used to refer to the same or like elements and any further repetitive explanation concerning the above elements may be omitted.

Referring to FIG. 28, a mounting substrate of a light emitting device package 11 may include first and second electrode portions separated by a recess, an insulation support member 122 filling a lower portion of the recess and covering a side surface of each of the first and second electrode portions, and a second insulation support member 132 filling an upper portion of the recess.

The first electrode portion may include a first lower electrode portion 110a and a first upper electrode portion 110b on the first lower electrode portion 110a, and the second electrode portion may include a second lower electrode portion 112a and a second upper electrode portion 112b on the second lower electrode portion 112a.

A first groove 120 may be formed between the first lower electrode portion 110a and the second lower electrode portion 112a, a second groove 130 may be formed between the first upper electrode portion 110b and the second upper electrode portions 112b, and the first groove 120 and the second groove 130 may be connected to each other to form the recess. A width of the first groove 120 may be the same as or greater than a width of the second groove 130.

The insulation support member 122 may fill up the first groove 120, cover side surfaces of the first and second lower electrode portions 110a and 112a, and expose the first and second upper electrode portions 110b and 112b. The second insulation support member 132 may fill up the second groove 130 and cover side surfaces of the first and second upper electrode portions 110b and 112b.

The insulation support member 122 and the second insulation support member 132 may have a height enough to prevent spreading of a solder bump.

The second insulation support member 132 may fill up the second groove 130 between the first and second upper electrode portions 110b and 112b, to thereby prevent spreading of the solder bump during a flip chip bonding process Hereinafter, a method of manufacturing the light emitting device package in FIG. 28 will be explained.

Figure 29:
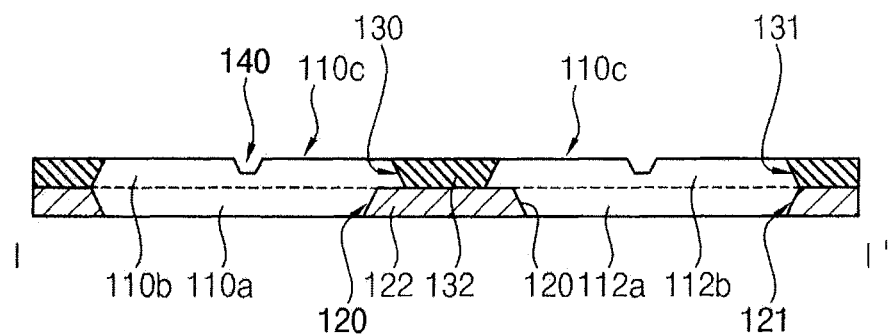
Figure 30:
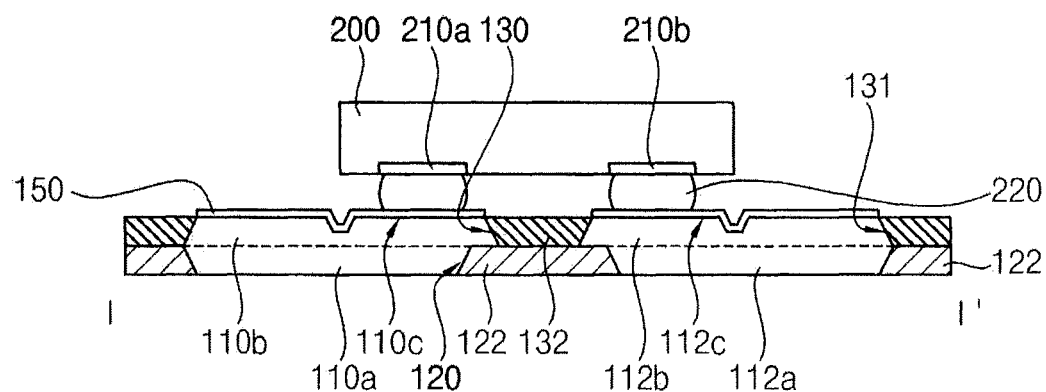

FIGS. 29 and 30 are cross-sectional views illustrating stages of manufacturing a light emitting device package in accordance with example embodiments.

Referring to FIGS. 29 and 30, first, the steps as illustrated with reference to FIGS. 5 to 18 maybe performed such that a first surface 102 of a metal substrate 100 is etched to form first and second upper electrode portions 110b and 112b separated by a second groove 130.

Then, after an insulation material is coated on the first surface 102 of the metal substrate 100, an upper portion of the coated insulation material may be removed until surfaces of the first and second upper electrode portions 110b and 112b are exposed, to form a second insulation support member 132.

The second insulation support member 132 may be formed to surround a side surface of the first upper electrode portion 110b. The second insulation support member 132 may be formed to surround a side surface of the second upper electrode portion 112b. The second insulation support member 132 may fill the second groove 130 and second edge grooves 131.

The second insulation support member 132 may include an insulating material such as epoxy molding compound (EMC), silicon molding compound (SMC), silicon resin (SR), etc. A surface of the second insulation support member 132 may be coplanar with the exposed surfaces of the first and second upper electrode portions 110b and 112b. Alternatively, the surface of the second insulation support member 132 may be lower or higher than the exposed surfaces of the first and second upper electrode portions 110b and 112b.

Then, after a light emitting device 200 and a diode 250 are mounted on the first and second upper electrode portions 110b and 112b, a transparent film 300 may be adhered onto an upper surface of the light emitting device 200 and a sealing member 400 may be formed to cover the light emitting device 200 and the transparent film 300.

Figure 31:
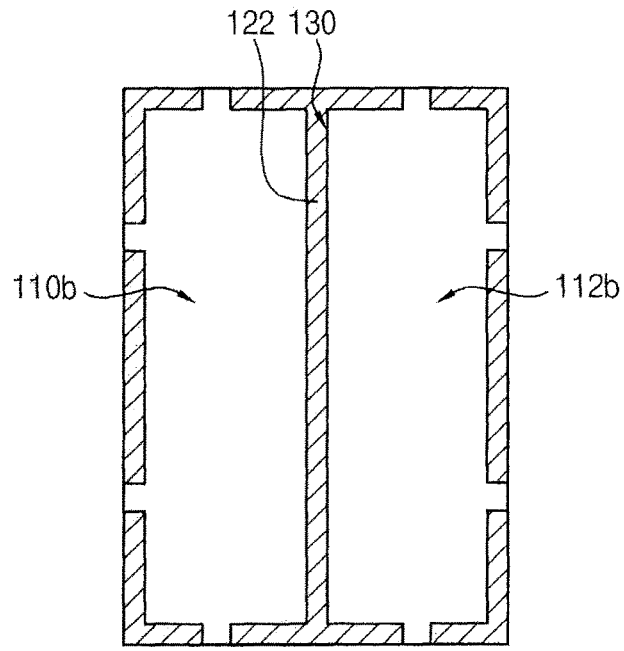

FIGS. 31 to 34 are plan views illustrating a mounting substrate of a light emitting device package in accordance with example embodiments. Referring to FIG. 31, a second groove 130 may be formed between a first upper electrode portion 110b and a second upper electrode portion 112b. The first groove 120 may be formed between a first lower electrode portion under the first upper electrode portion 110b and a second lower electrode portion under the second upper electrode portion 112b. An insulation support member 122 may fill the first groove and cover side surfaces of the first and second lower electrode portions.

The second groove 130 may be connected to the first groove to form a recess across a mounting substrate. The second groove 130 may extend in a straight line along a first direction. Accordingly, the recess may have a shape extending in the first direction.

Figure 32:
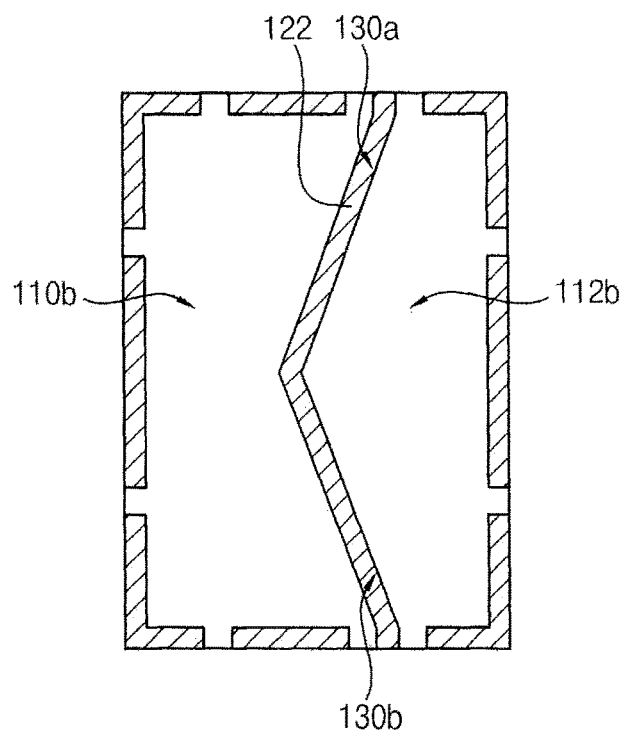

Referring to FIG. 32, a second groove 130 may include third and fourth extending groove portions 130a and 130b extending in different directions. The third extending groove portion 130a may extend in a third direction, and the fourth extending groove portion 130b may extend from an end portion of the third extending groove portion 130a in a fourth third direction different from the third direction.

Accordingly, the recess may include a first extending recess portion extending in the third direction and a second extending recess portion extending in the fourth direction.

Since the recess has a notched portion, a mounting substrate may resist damage due to impact exerted when a light emitting device is mounted on the mounting substrate.

Figure 33:
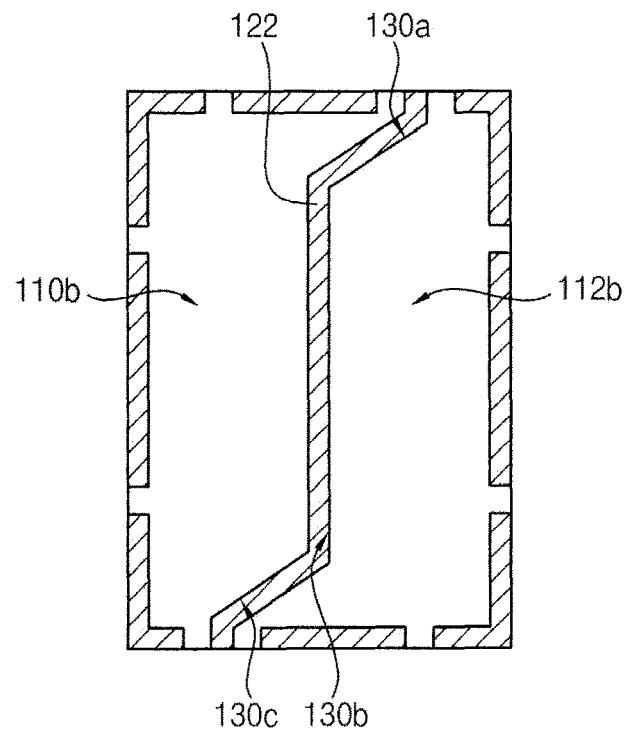

Referring to FIG. 33, a second groove 130 may include third, fourth and fifth extending groove portions 130a, 130b and 130c. The third extending groove portion 130a may extend in a third direction, the fourth extending groove portion 130b may extend from an end portion of the third extending groove portion 130a in a fourth direction different from the third direction, and the fifth extending groove portion 130c may extend from an end portion of the fourth extending groove portion 130b in the third direction.

Accordingly, the recess may include a first extending recess portion extending in the third direction, a second extending recess portion extending in the fourth direction and a third extending recess portion extending in the fourth direction.

Figure 34:
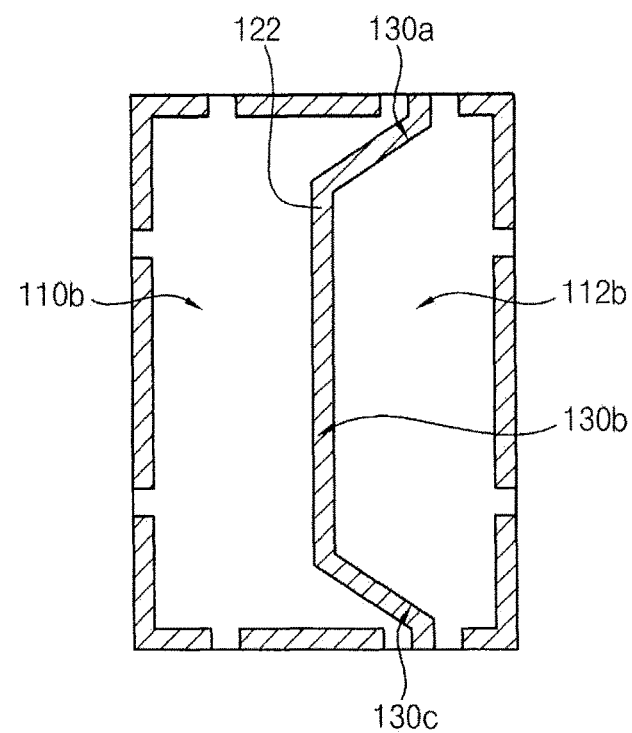

Referring to FIG. 34, a second groove 130 may include third, fourth and fifth extending groove portions 130a, 130b and 130c. The third extending groove portion 130a may extend in a third direction, the fourth extending groove portion 130b may extend from an end portion of the third extending groove portion 130a in a fourth direction different from the third direction, and the fifth extending groove portion 130c may extend from an end portion of the fourth extending groove portion 130b in a fifth direction that is different than the third and fourth directions.

Since the recess includes a notched portion, the mounting substrate may resist damage due to impact exerted when a light emitting device is mounted on the mounting substrate.

A packaged light emitting device in accordance with example embodiments may be used in various illumination devices. For example, the packaged light emitting device may be arranged in a matrix array to constitute a light emitting module of an illumination device.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances, are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed:

1. A packaged light emitting device, comprising:
    a mounting substrate comprising first and second electrode portions separated by a first recess defined by a first side surface of the first electrode portion and a second side surface of the second electrode portion that is opposite the first side surface, wherein the first recess extends from the first side surface to the second side surface;
    a second recess in an upper surface of the first electrode portion;
    a first connection member coupling the light emitting device to the first electrode portion between the first recess and the second recess;
    a third recess in an upper surface of the second electrode portion;
    a second connection member coupling the light emitting device to the second electrode portion between the first recess and the third recess;
    an insulation support member partially filling a lower portion of the first recess to partially cover the first side surface and partially cover the second side surface;
    a light emitting device coupled to the first and second electrode portions of the mounting substrate in a flip chip configuration; and
    a sealing member on the mounting substrate covering the light emitting device,
    wherein the first electrode portion comprises a first lower electrode portion and a first upper electrode portion, the second electrode portion comprises a second lower electrode portion and a second upper electrode portion, and the insulation support member covers portions of the first and second side surfaces defined by the first and second lower electrode portions, respectively, and
    wherein an electroplating layer is formed on surfaces of the first and second upper electrode portions.

2. The packaged light emitting device of claim 1, wherein the insulation support member exposes the first upper electrode portion and the second upper electrode portion.

3. The packaged light emitting device of claim 1, wherein the first recess is defined by:
    a first groove between the first lower electrode portion and the second lower electrode portion; and
    a second groove above the first groove between the first upper electrode portion and the second upper electrode portion, the first groove and the second groove are connected to each other to define the recess.

4. The packaged light emitting device of claim 3, wherein the insulation support member fills the first groove.

5. The packaged light emitting device of claim 1, wherein the first recess includes first and second extending groove portions extending in different directions in the mounting substrate.

6. The packaged light emitting device of claim 1 further comprising:
    a second insulation support member filling an upper portion of the first recess.

7. The packaged light emitting device of claim 6 further comprising:
    a transparent film covering an upper surface of the light emitting device through which light is emitted.

8. The packaged light emitting device of claim 1, wherein an upper surface of the sealing member is beveled to define an obtuse angle between the upper surface and a side surface of the sealing member.

9. The packaged light emitting device of claim 1, wherein the first lower electrode portion and the first upper electrode portion are separately formed structures, and the second lower electrode portion and the second upper electrode portion are separately formed structures.

10. A packaged light emitting device, comprising:
a mounting substrate including first and second lower electrode portions separated from one another by a first groove in a first surface of the mounting substrate, first and second upper electrode portions on the first and second lower electrode portions respectively, the first and second upper electrode portions separated from one another by a second groove in a second surface of the mounting substrate that is opposite the first surface, the second groove connected to the first groove;
first and second connection members electrically connected to the first and second upper electrode portions, respectively, the first and second grooves being located between the first and second connection members having;
first and second electrodes on the light emitting device opposite the first and second upper electrode portions respectively, the first and second electrodes electrically connected to the first and second upper electrode portions, respectively, by the first and second connection members respectively;
a first recess in the second surface of the mounting substrate, wherein the first connection member is located between the second groove and the first recess;
a second recess in the second surface of the mounting substrate, wherein the second connection member is located between the second groove and the second recess;
an insulation support member filling the first groove;
a light emitting device mounted on the first and second upper electrode portions in a flip chip configuration;
a transparent film covering a light emitting surface of the light emitting device; and
a sealing member on the mounting substrate covering a portion of the light emitting device and a diode.

11. The packaged light emitting device of claim 10, wherein the insulation support member on opposing side surfaces of the first and second lower electrode portions and exposes opposing side surfaces of the first and second upper electrode portions.

12. The packaged light emitting device of claim 10, further comprising:
a second insulation support member filling the second groove.

13. The packaged light emitting device of claim 10, wherein an upper side edge of the sealing member is beveled to form an obtuse angle with a side surface of the sealing member.

* * * * *